United States Patent [19]

Gärtner et al.

[11] Patent Number: 4,894,256
[45] Date of Patent: Jan. 16, 1990

[54] PROCESS FOR GLOW-DISCHARGE-ACTIVATED REACTIVE DEPOSITION OF METAL FROM A GAS PHASE

[75] Inventors: Georg F. Gärtner, Aachen; Peter A. Janiel, Würselen, both of Fed. Rep. of Germany

[73] Assignee: U.S. Philips Corporation, New York, N.Y.

[21] Appl. No.: 264,488

[22] Filed: Oct. 28, 1988

[30] Foreign Application Priority Data

Nov. 17, 1987 [DE] Fed. Rep. of Germany ....... 3738993

[51] Int. Cl.$^4$ .............................................. B05D 3/06
[52] U.S. Cl. .................................... 427/39; 427/237; 427/253; 427/255.2
[58] Field of Search .............. 427/39, 237, 253, 255.1, 427/255.2

[56] References Cited

U.S. PATENT DOCUMENTS 4,713,259 12/1989 Gartner et al. ........................ 427/39

Primary Examiner—Bernard Pianalto
Attorney, Agent, or Firm—Norman N. Spain

[57] ABSTRACT

1. Process for flow-discharge-activated reactive deposition of metal from a gas phase.
2.1 For the reactive deposition of tubular metal bodies from a flowing gas phase which contains a metal halide, a glow discharge is generated between an inner electrode and an outer electrode, one of which is of tubular construction and serves as substrate. Under these circumstances, an unexpectedly low yield of the metal deposition is obtained in some cases. The novel process is intended to ensure a high metal deposition.
2.2 The reactive deposition from the gas phase is carried out in the high plasma resistance range. A preferred technique for establishing the high plasma resistance is to adjust the absolute mass flow of the metal halide to at least 60 sccm.
2.3 The novel process makes it possible to manufacture self-supporting thermionic cathodes and other self-supporting materials, layers and shaped bodies for high-temperature applications.
3. FIG. 2 is a plot showing the variation of the voltage drop Upl between cathode and anode with the absolute metal-halide mass flow $Q_{abs}$.

6 Claims, 3 Drawing Sheets

PROCESS FOR GLOW-DISCHARGE-ACTIVATED REACTIVE DEPOSITION OF METAL FROM A GAS PHASE

The invention relates to a process for reactive deposition of tubular metal bodies on a tubular substrate from a flowing gas phase containing a metal halide, a glow discharge being generated between an inner electrode and an outer electrode, one of which is of tubular construction and serves as substrate.

A process of this type is known from European Published Application No. 204,356 which corresponds to U.S. Pat. No. 4,713,259. In the process described therein, a controlled reciprocating movement of the inner electrode relative to the outer electrode takes place. Between the inner electrode and the outer electrode, a locally limited glow discharge zone is produced which is maintained during the deposition. At the same time, steps are taken to prevent the formation of electrically conducting layers on electrically insulating structural parts in the reaction chamber. The temperature in the substrate region is kept constant at a low value at which the thermal deposition rate is small compared with the glow discharge deposition rate.

In the known process, mass flows of tungsten fluoride of up to 50 sccm, i.e. up to 50 cm$^3$/min, referred to standard conditions (0° C., 10$^5$ Pa), are used. The known process has the disadvantage that in some cases an unexpectedly low yield of the metal deposition is obtained.

The invention is based on the object of ensuring a high metal deposition.

This object is achieved, according to the invention in that, in a process of the type mentioned in the introduction, the reactive deposition from the gas phase is carried out in the high plasma resistance range.

A preferred technique for establishing the high plasma resistance is to adjust the absolute mass flow of the metal halide to at least 60 sccm. An increase in absolute mass flow of the metal halide is limited only by the flow cross section in the mass flow regulator used in the particular case.

Additional advantageous measures for achieving a high metal deposition, in some cases even 100%, consist in, that the glow discharge is generated with a discharge current of at least 0.4 A and/or that the flowing gas phase contains at least one fluoride of tungsten, molybdenum or rhenium and also, additionally, an inert gas and hydrogen, and/or that for the deposition of multicomponent material, the flowing gas phase contains at least one organometallic compound of an element of group IIIb of the periodic system (scandium group and actinides) as a further component, and/or that the flowing gas phase contains tungsten fluoride and hydrogen in the molecular ratio H$_2$:WF$_6$=6 to 8:1, and/or that the glow discharge is generated between a tubular outer electrode serving as a substrate and an inner electrode, the length of the part of the inner electrode which projects into the glow discharge being equal to the inside diameter of the outer electrode or greater than the inside diameter thereof.

The process according to the invention has the advantage that, as a result of the high yield achieved, the waste disposal problem has decreased at the same time.

Processes for reactive deposition of layers and shaped bodies from a gas phase are known as CVD processes. Processes in which the deposition reaction is activated by a plasma are known as PCVD processes.

The teaching of using a high plasma resistance in a PCVD process in which electrically conducting layers are deposited is based on investigations of the direct current glow discharge in a gas mixture composed of tungsten hexafluoride (WF$_6$), hydrogen (H$_2$) and argon (Ar) in which novel and hitherto unexpected properties of the plasma were found, the knowledge of which is necessary for an optimum process control and process yield. It was established that, depending on the *absolute* WF$_6$ mass flow, two different plasma states of the WF$_6$+H$_2$+Ar plasma exist which differ primarily in the plasma resistance. Depending on the geometry and process parameters such as pressure, temperature and glow-discharge current, either a fairly abrupt or a continuous transition between the two states is obtained in a plot, shown in the drawing, of the voltage drop U$_{p1}$ between cathode and anode against the absolute WF$_6$ mass flow $\dot{Q}_{abs}$ (WF$_6$) with otherwise constant conditions. In this connection, the high plasma resistance state is reached at an absolute WF$_6$ mass flow or flow rate of about 60 sccm. However, said transition is not determined by the relative WF$_6$ proportion, as it was possible to demonstrate by sharply varying the Ar gas flow, but only by the absolute WF$_6$ mass flow. The change in Q (Ar) leads only to a slight displacement of U$_{p1}$($\dot{Q}$(WF$_6$)). According to a theoretical model set up by F Weling microwave-plasma-activated CVD in a tubular reactor with a flow through it (J. Appl. Phys. 57 (1985) 4441–4446, a reduction in the flow velocity and consequently in the mass flow should also yield a 100% deposition in the tube if the power absorbed in the plasma is sufficiently high. However, this does not apply to the case of the glow discharge in gas containing WF$_6$. The experiment shows that a high deposition can be achieved only in the high plasma resistance state (high discharge voltage). A reduction in the WF$_6$ mass flow produces, surprisingly, also a considerable reduction in the yield. For a high process yield, it is therefore necessary in the case of the glow discharge in WF$_6$+H$_2$+Ar to choose the process parameters in the range of the high plasma resistance state. This is due essentially to the non-linear relationship between U$_{p1}$ and $\dot{Q}$(WF$_6$).

The presence of two plasma states is apparently associated with the fact that WF$_6$ is a strongly electro-negative gas and has a relatively high dielectric breakdown strength. At lower electron energies in particular, electron capture can result in negative ions being formed which migrate to the anode and have a much lower mobility than the much faster electrons so that the plasma resistance increases. This results, as a rule, in the formation of a negative ion space-charge cloud in front of the anode and, additionally, in an intensified positive ion cloud in front of the cathode and consequently in an increase in the plasma resistance with increasing WF$_6$ density.

From the literature (H. Boenig, Plasma Science and Technology, Cornell Univ. Press, page 49), the existence of two different plasma states of the positive column in a pure O$_2$ plasma is known. They are described by their discoverer Güntherschulze (1927) as the H and T form and differ in high voltage gradients and greyish green luminescence or deeper, i.e. lower, voltage gradients of the direct current discharge and violet colour.

The H form exists at higher currents and lower pressures than the T form. If they exist simultaneously, the two forms are spatially separated, the H form being situated on the anode side and the T form on the cathode side.

On the other hand, the two plasma states now found in the $WF_6+H_2+Ar$ mixture exhibit, in contrast to those in the pure $O_2$ plasma, a different behaviour. The state with high voltage drop occurs specifically at high $WF_6$ mass flow, i.e. high $WF_6$ partial pressure, which is consistent with the lower discharge voltage in the $Ar+H_2$ plasma, the effect of which dominates at low $WF_6$ content. Despite these essential differences, the descriptions H and T form are adopted here.

The layer composition generated in the case of a multicomponent deposition, for example together with thorium bifluroacetyl acetonate, is affected by the W yield which is dependent on the $WF_6$ mass flow so that the W component increases more than proportionally with increasing $WF_6$ flow. This effect has to be taken into account in trying to achieve a specified solid-state composition. A further effect, however, plays an additional role in this particular case. If the $Th(tfa)_4$ mass flow is increased with constant $WF_6$ mass flow and initially 100% W yield, the latter decreases markedly and a more than proportionate decrease in the W component is again obtained, probably due to the additional blocking of surface centres. The above finding is therefore also applicable in achieving specified concentrations. Consequently, it is not the $Q(WF_6):Q(Th(tga)_4)$ which is decisive, but the absolute flows. An analogous behavior is also found if $WF_6$ is replaced by, for example, $ReF_6$ or $MoF_6$, i.e. the existence of two plasma states must also be taken into account, for example, in the case of $ReF_6+H_2+Ar$ or in the case of $MoF_6+H_2+Ar$ plasmas, and in that case, too, $U_{pl}(Q(Me_nF_m))$ has therefore to be measured for an optimization (me=W, Mo, Re; F=Fluorine).

The process according tot he invention can be applied in the manufacture of self-supporting thermionic cathodes. The self-supporting materials, layers and shaped bodies manufactured by the process according tot he invention are, however, also suitable for other high-temperature applications. These are, for example, internal walls of rocket jets, internal tubes of high-power lasers, protective containers or coatings in and around nuclear reactor components or inside walls of plasma chambers.

The invention is explained in more detail with reference to a drawing, which also contains the diagram already mentioned, and some embodiments of the invention. In the drawings:

DETAILED DESCRIPTION OF THE DRAWING

Figure 1:
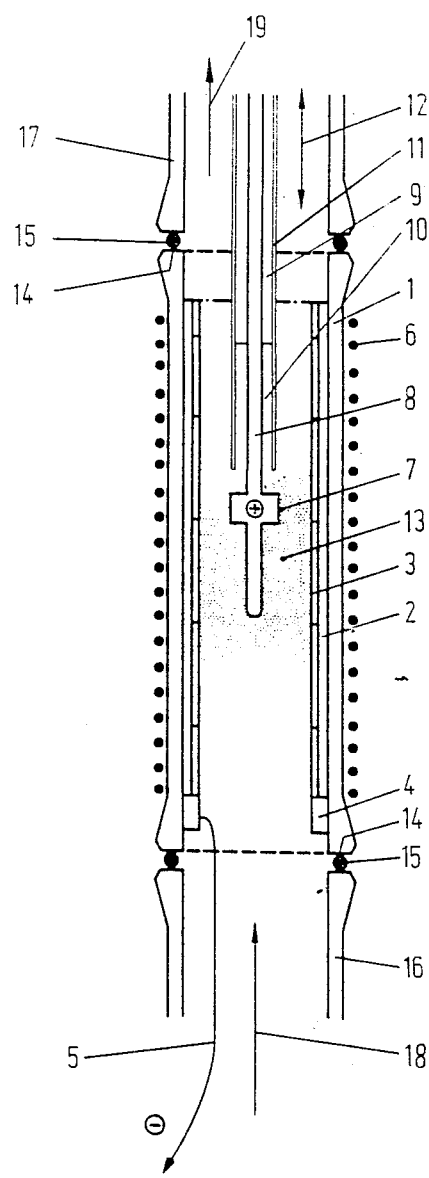
FIG. 1 shows an apparatus for carrying out glow-discharge-activated reactive depositions schematically in section.

FIG. 1 shows diagrammatically a detail of the region of the reaction chamber. Inserted in a tube 1 which is composed of quartz is a second stainless-steel tube 2, which may be capable of being assembled from tubes of shorter length, and coaxially stacked therein are thin substrate cylinders 3 on a metal ring 4 made of copper or stainless steel. An electrical connection 5 for the cathode is fed from the metal ring 4 via a vacuum current lead-through (not shown) to the negative pole of a direct current mains unit (now shown). Heating windings 6 are additionally wound round tube 1 for keeping the substrate cylinders or substrate tubes at a specified temperature, for example at a temperature of 370° C. or less, or for ensuring an equalization of the heat supply through the plasma which varies with time, for which purpose, depending on external insulation and the time for which the plasma is switched on, & a heating power of about 340 W is necessary. Coaxially situated in the tube axis is an inner electrode 7 which is normally connected as an anode and which can be moved along said axis by means of a linear drive (not shown) and a vacuum lead-through (not shown). The inner electrode, which is constructed as a disc with projecting pin, is screwed onto a stainless-steel mounting rod 8, which also serves as current supply lead. The mounting rod is encased by a screening cylinder 9 made of $Al_2O_e$ ceramic. An annular gap 10 which is about 1 to 2 mm wide and several centimeters deep and which prevents a continuous electrically conducting growth starts a short distance in front of the electrode or anode 7. The screening cylinder 9 is surrounded, at least in the vicinity of the anode 7, by an outer sleeve 11 which is composed of a material which prevents any peeling off of electrically conducting growth. Such a material is, for example, electrographite. The ability of the anode 7 to move along with the mounting rod 8 and the screening cylinder 9 is indicated by a double arrow 12.

A glow discharge 13 forms between the anode 7 and the substrate cylinders 3. The tube 1 is joined to the rest of the equipment 16, 17 via a flange 14 having sealing rings 15 made of heat-resistant synthetic resin. The gas supply, which is indicated by an arrow 18, takes place at the side facing away from the anode while the gas removal, which is indicated by an arrow 19, takes place at the anode side.

Figure 2:
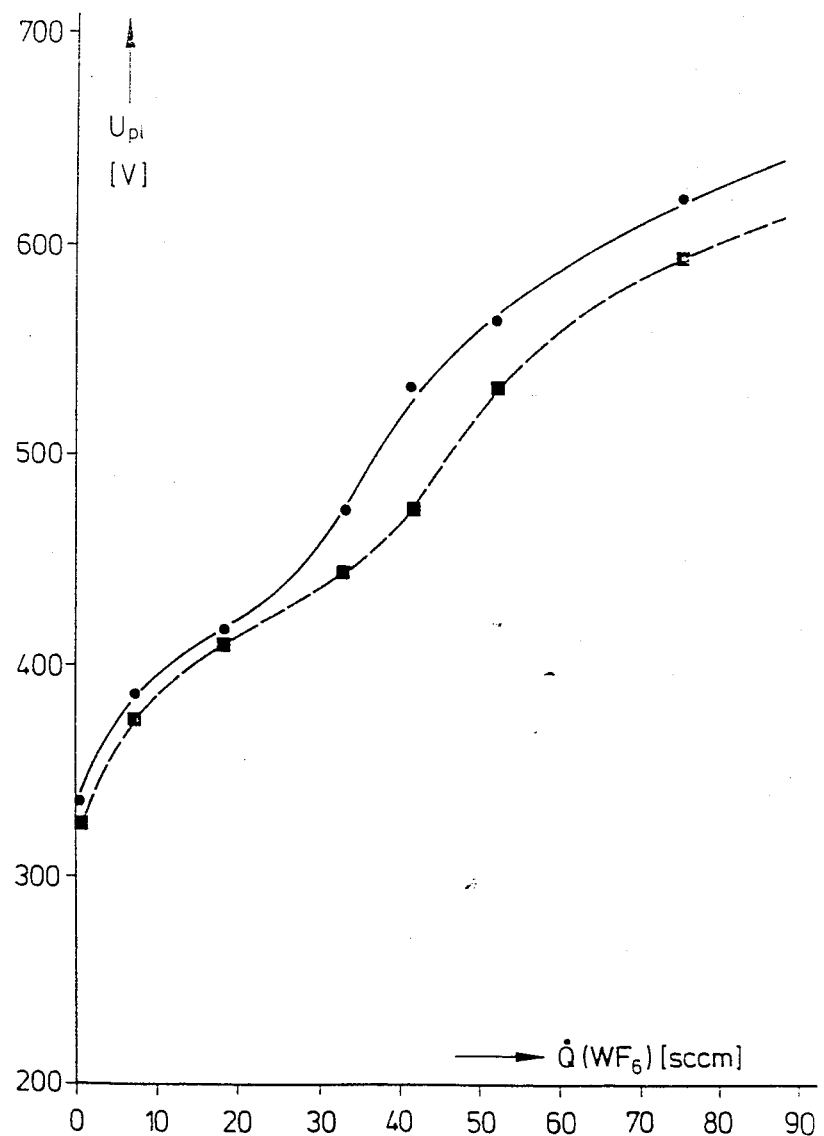
FIG. 2 is a diagram showing the variation of the voltage drop between cathode and anode with the absolute $WF_6$, mass flow.

FIG. 2 shows the discharge voltage $U_{pl}$ as a function of the $WF_6$ mass flow. The measurements on which the curves in FIG. 2 are based were obtained with mass flows of $Q(H_2)=370$ sccm
$Q(Ar)=375$ sccm with a mass flow $Q_{abs}(WF_6)$ rising from 0 to 90 sccm. The measurements which correspond to the continuously drawn curve were obtained with a discharge current of $I_{pl}=0.45$ A,
a total pressure of p $=8.3$ hPa
and a mean outside wall temperature of $T_m=370°C$.
while the measurements corresponding to the broken curve were obtained with
$I_{pl}=0.45$ A
$p=12$ hPa
$T_m=370°$ C.

Figure 3:
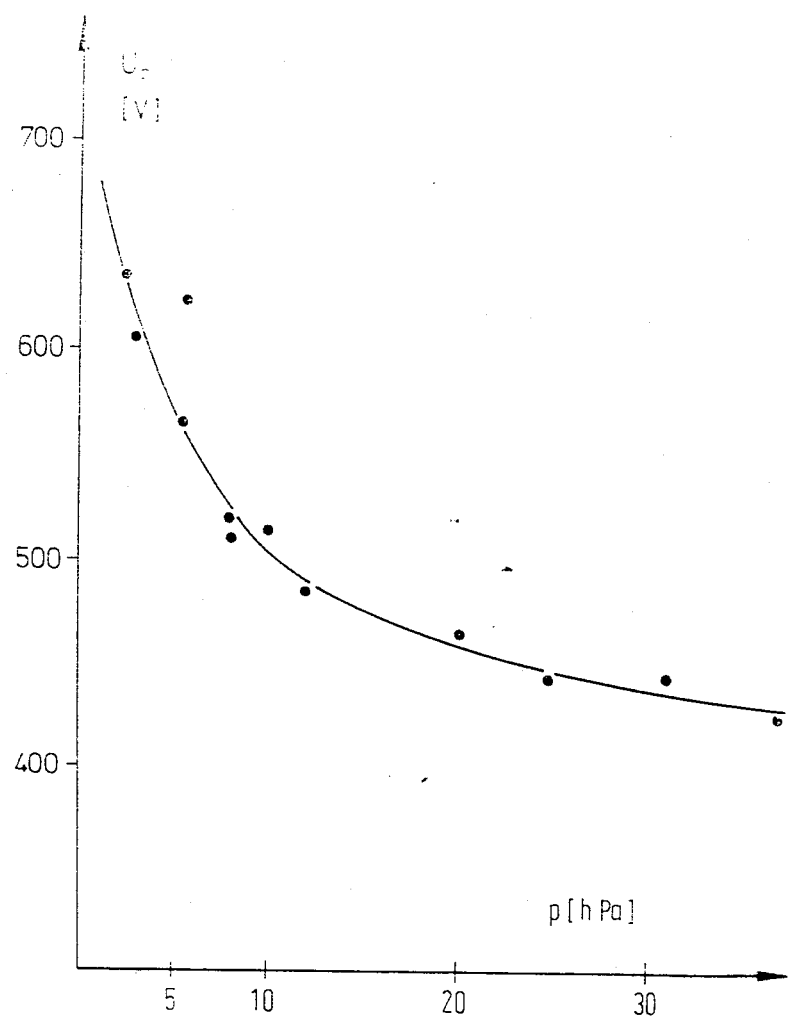
FIG. 3 is a diagram showing the voltage drop as a function of the total pressure.

FIG. 3 shows the discharge voltage $U_{pl}$ as a function of the total pressure p in the reaction space for $Q(WF_6)=62$ sccm
$Q(H_2)=370$ sccm
$Q(Ar)=326$ sccm and a mean outside wall temperature of 420° C.

A conspicuous fact is that up to a total pressure of about 40 hPa, no renewed rise in the discharge voltage is detectable, as would be expected according to the Paschen law for rising pressure on the other side of the minimum in the discharge voltage. In contrast to the reactor with a flow through it, the Paschen law is valid, however, first of all for a stationary gas phase so that the effect of the flow has still to be taken into account in this case.

In order to achieve an increase in the plasma power $L_{pl}$, the total pressure can therefore also be decreased and specifically, particularly effectively in the high plasma resistance region.

In experiments which were carried out with the apparatus shown in FIG. 1, the following optimum conditions for a 100% deposition were found:

| | |
|---|---|
| adequate anode length: | $l_A \gtrsim 35$ mm |
| | $I_{pl} \gtrsim 0.4$ A |
| $\dot{Q}(WF_6) = 18$ to 90 sccm | |
| $H_2:WF_6 = 6:1$ to 8:1, preferably 6.6:1 | |
| total pressure | $p \gtrsim 12$ hPa |
| | $U_{pl} \gtrsim 420$ V |
| | $L_{pl} \gtrsim 200$ W. |

FIG. 2 shows a plot of the variation of the voltage drop $U_{pl}$ between cathode and anode with the absolute metal-halide mass flow $Q_{abs}$.

What is claimed is:

1. A process for the reactive deposition of tubular metal bodies on a tubular substrate from a flowing gas phase containing a metal halide by a glow discharge generated in said gas phase and extending between an inner electrode and an outer electrode, one of which electrodes is tubular and serves as said substrate, characterized in that the absolute mass flow of the metal halide is adjusted to at least 60 sccm and the reactive deposition from the gas phase is carried out in the high plasma resistance range.

2. Process according to claim 1 characterized in that the glow discharge is generated between a tubular outer electrode serving as a substrate and an inner electrode, the length of the part of the inner electrode which projects into the glow discharge being equal to the inside diameter of the outer electrode or greater than the inside diameter thereof.

3. Process according to claim 1, characterized in that the glow discharge is generated with a discharge current of at least 0.4 A.

4. Process according to claim 1, characterized in that the flowing gas phase contains at least one fluoride of tungsten, molybdenum or rhenium and also, additionally, an inert gas and hydrogen.

5. Process according to claim 4, characterized in that, for the deposition of multicomponent material, the flowing gas phase contains at least one organometallic compound of an element of group IIIb of the periodic system as a further component.

6. Process according to claim 4, characterized in that the flowing gas phase contains tungsten fluoride and hydrogen in the molecular ratio $H_2:WF_6 = 6$ to 8:1.

* * * * *